United States Patent
Thalakkal Kottilaveedu et al.

(10) Patent No.: US 9,153,295 B2
(45) Date of Patent: Oct. 6, 2015

(54) REGISTER BANK CROSS PATH CONNECTION METHOD IN A MULTI CORE PROCESSOR SYSTEM

(71) Applicant: Texas Instruments Incorporated, Dallas, TX (US)

(72) Inventors: Pratheesh Gangadhar Thalakkal Kottilaveedu, Bangalore (IN); William C Wallace, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 29 days.

(21) Appl. No.: 14/045,995

(22) Filed: Oct. 4, 2013

(65) Prior Publication Data

US 2014/0101383 A1    Apr. 10, 2014

Related U.S. Application Data

(60) Provisional application No. 61/709,373, filed on Oct. 4, 2012.

(51) Int. Cl.
G06F 13/12    (2006.01)
G06F 13/00    (2006.01)
G11C 7/10    (2006.01)
G11C 8/04    (2006.01)
G06F 9/30    (2006.01)

(52) U.S. Cl.
CPC ............ G11C 7/1036 (2013.01); G06F 9/3012 (2013.01); G11C 8/04 (2013.01)

(58) Field of Classification Search
None
See application file for complete search history.

(56) References Cited

U.S. PATENT DOCUMENTS 4,800,486 A * 1/1989 Horst et al. ............... 714/25
7,197,627 B1 * 3/2007 Naylor ..................... 712/34

* cited by examiner

Primary Examiner — Idriss N Alrobaye
Assistant Examiner — Richard B Franklin
(74) Attorney, Agent, or Firm — Robert D. Marshall, Jr.; Frank D. Cimino

(57) ABSTRACT

Scratch pad register banks are used as shared fast access storage between processors in a multi processor system. Instead of the usual one to one register mapping between the processors and the scratch pad register banks, an any to any mapping is implemented. The utilization of the scratch pad register banks is improved as the any to any mapping of the registers allow the storage of any processor register anywhere in the scratch pad register bank.

11 Claims, 1 Drawing Sheet

REGISTER BANK CROSS PATH CONNECTION METHOD IN A MULTI CORE PROCESSOR SYSTEM

CLAIM OF PRIORITY

This application claims priority under 35 U.S.C. 119(e)(1) to Provisional Application No. 61/709,373 filed 4 Oct. 2012.

TECHNICAL FIELD OF THE INVENTION

The technical field of this invention is interprocessor communications.

BACKGROUND OF THE INVENTION

In a multiprocessor system a large amount of metadata, such as logical to physical address mapping and inter processor communications is shared by multiple processor cores, and may require more registers than what is available in the processors. This may require context saving of the registers, creating problems in real time operations.

SUMMARY OF THE INVENTION

A scratchpad register bank is implemented with a remap function that allows rapid saving and loading of the processor's registers into the temporary registers. The remap function allows remapping of the registers during both the store and load operations.

BRIEF DESCRIPTION OF THE DRAWINGS

These and other aspects of this invention are illustrated in the drawings, in which.

DETAILED DESCRIPTION OF PREFERRED EMBODIMENTS

RISC architectures have instructions (XIN/XOUT) to load/store registers or entire register files into scratch memory shared between cores in single cycle. This operation also insures data consistency of the scratch memory by associating priority of access from multiple cores to this memory. The shift/remap function specifies an offset (currently by register (32-bit), but can be implemented to be byte or bit based depending on the implementation tradeoffs) for the scratchpad register banks. With this enhancement one can do any register array to any register array load/store from scratchpad memory or scratchpad register with one cycle overhead for specifying the offset.

Effectively one can load/store 16 registers (depending on data bus width) in 2+2 cycles compared to 18+17 cycles from internal memory of the core. This is a significant saving in the context of hard real time requirements. Overhead of loading metadata keys for binary search is 2/32 cycles (6%) compared to 56% above. Storing the metadata's key information separately eases binary search operations as RISC cores are register limited. This invention allows full utilization of register scratch banks and helps to save auxiliary metadata in a different bank at some register index—effectively maintaining a linked list in register banks and allowing access for real time processors into any of the registers reserved for processing.

In the real time core, context save/restore overhead can be reduced to 2+2 cycles compared to 35 cycles. This is a significant reduction considering most critical tasks of a real time core needs to be invoked every 500 cycles. Overhead show above is down from 7% to 0.8%.

Figure 1:
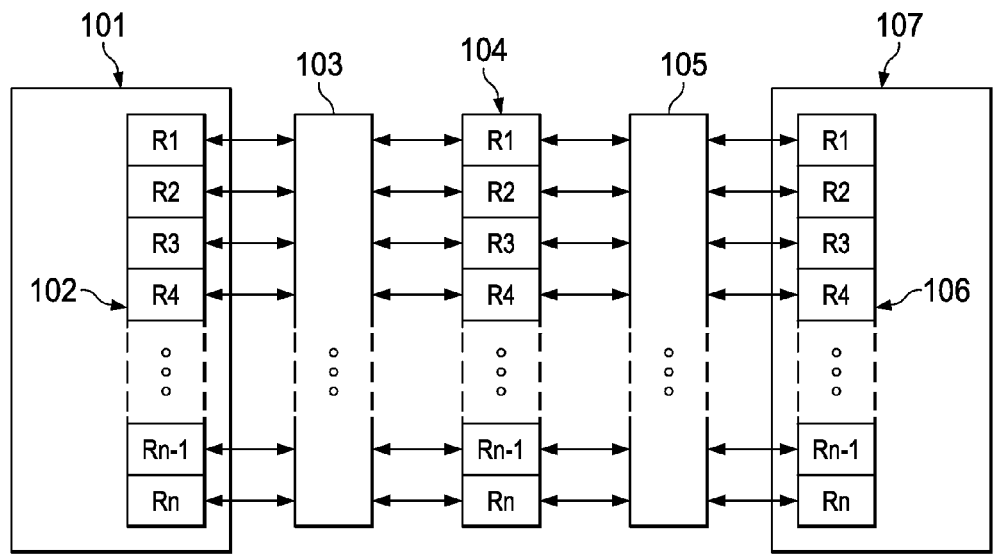
FIG. 1 shows a block diagram of scratch pad register system implementing the remapping function.

As shown in FIG. 1, the registers in register bank 102 in processor 101 are connected to scratchpad register bank 104, through multiplexer/barrel shifter 103. Block 103 is operable to shift the registers with wrap around, both during writes from processor 101 to the scratchpad register bank 104, and reads by processor 101 from scratchpad register bank 104.

Scratchpad register bank 104 is further connected to register bank 106 in processor 107 through multiplexer/barrel shifter 105. Block 105 is operable to shift the registers with wrap around, both during writes from processor 107 to the scratchpad register bank 104, and reads by processor 107 from scratchpad register bank 104.

Figure 2:
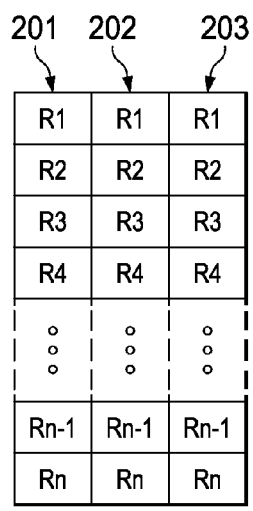
FIG. 2 shows the scratch pad register bank implemented using a plurality of register banks.

Scratchpad register bank 104 may be implemented as multiple banks for added flexibility. One implementation shown in FIG. 2 employs scratchpad register banks 201, 202 and 203.

Multiplexer/barrel shifters 103 and 105 may be implemented as a multiplexer, a barrel shifter or a crossbar switch, or any combination of these.

As an example, we can use register R1.b0 to hold the address remap offset.

Assuming each scratchpad register bank has 30 registers R0:R29

MOV R1.b0, 4//Specify an offset of 4

XOUT 20, R4, 16//Store R4:R7 to R8:R11 in scratchpad register bank 20, XOUT destination: 4+4=8

MOV R1.b0, 9//Specify an offset of 9

XOUT 21, R25, 20//Store R25:R29 to R4:R9 in scratchpad register bank 20. XOUT destination will wrap around: (25+9−30)=4

MOV R1.b0, 10//Specify an offset of 10

XIN 21, R4, 12//Load R14:R16 to R4:R6. XIN source: 4+10=14

What is claimed is:

1. A multi core processor system comprising of:
   a plurality of processor cores containing embedded register banks, each embedded register bank including an address remap offset register,
   a plurality of logic blocks each connected to a corresponding one of said embedded register banks operable to remap the addresses of the registers within said corresponding register bank,
   a scratch pad register bank connected to each of said plurality of logic blocks, and
   each of said plurality of processor cores operable in response to a bank store instruction (XOUT) to store data from an instruction specified plurality of registers of said corresponding register bank into said scratch pad register bank as offset by said corresponding logic block an amount corresponding to offset data stored in said corresponding address remap offset register.

2. The multi core processor system of claim 1 wherein:
   each of said plurality of logic blocks includes a multiplexer whereby the register addresses are remapped by said multiplexer.

3. The multi core processor system of claim 1 wherein:
   each of said plurality of logic blocks includes a barrel shifter whereby the register addresses are remapped by said barrel shifter.

4. The multi core processor system of claim 1 wherein:
each of said logic unit implements the register address remapping by wrap around when address boundaries are encountered.

5. The multi core processor system of claim 1 further comprising:
at least one additional scratch pad register bank, and
wherein each of said plurality of processor cores is further operable in response to said bank store instruction (XOUT) to store data from an instruction specified plurality of registers of said corresponding register bank into an instruction specified scratch pad register bank as offset by said corresponding logic block an amount corresponding to said offset data.

6. The multi core processor system of claim 1 wherein:
each of said plurality of processor cores is further operable in response to a bank load instruction (XIN) to store data from an instruction specified plurality of registers of said scratch pad register bank into said corresponding register bank as offset by said corresponding logic block an amount corresponding to said offset data.

7. A multi core processor system comprising of:
a plurality of processor cores containing embedded register banks, each embedded register bank including an address remap offset register,
a plurality of logic blocks each connected to a corresponding one of said embedded register banks operable to remap the addresses of the registers within said corresponding register bank,
a scratch pad register bank connected to each of said plurality of logic blocks, and
each of said plurality of processor cores is further operable in response to a bank load instruction (XIN) to store data from an instruction specified plurality of registers of said scratch pad register bank into said corresponding register bank as offset by said corresponding logic block an amount corresponding to offset data stored in said corresponding address remap offset register.

8. The multi core processor system of claim 7 wherein:
each of said plurality of logic blocks includes a multiplexer whereby the register addresses are remapped by said multiplexer.

9. The multi core processor system of claim 7 wherein:
each of said plurality of logic blocks includes a barrel shifter whereby the register addresses are remapped by said barrel shifter.

10. The multi core processor system of claim 7 wherein:
each of said logic unit implements the register address remapping by wrap around when address boundaries are encountered.

11. The multi core processor system of claim 7 further comprising:
at least one additional scratch pad register bank, and
wherein each of said plurality of processor cores is further operable in response to said bank load instruction (XIN) to store data from an instruction specified plurality of registers of an instruction specified scratch pad register bank into said corresponding register bank as offset by said corresponding logic block an amount corresponding to said offset data.

* * * * *